United States Patent [19]

Sugino

[11] Patent Number: 4,839,218
[45] Date of Patent: Jun. 13, 1989

[54] COMPOSITE POLYESTER SHEET AND PROCESS FOR ITS PRODUCTION

[75] Inventor: Satoru Sugino, Yokkaichi, Japan

[73] Assignee: Mitsubishi Kasei Vinyl Company, Tokyo, Japan

[21] Appl. No.: 181,669

[22] Filed: Apr. 14, 1988

[30] Foreign Application Priority Data

Apr. 24, 1987 [JP] Japan .................... 62-101375

[51] Int. Cl.⁴ .................................... B32B 7/02
[52] U.S. Cl. .................................... 428/212; 428/480;
428/483; 428/423.7; 428/424.6; 428/518;
428/413; 427/393.5; 427/412.5
[58] Field of Search ............ 428/480, 483, 212, 423.7,
428/424.6, 901, 518, 413; 427/393.5, 412.5

[56] References Cited

U.S. PATENT DOCUMENTS 4,208,468  6/1980  Cunningham et al. ............ 428/483

FOREIGN PATENT DOCUMENTS 2148261  7/1987  Japan .................... 428/483

Primary Examiner—George F. Lesmes
Assistant Examiner—A. Harbin
Attorney, Agent, or Firm—Oblon, Fisher, Spivak, McClelland & Maier

[57] ABSTRACT

A composite polyester sheet which comprises a polyester film, a layer of a vinyl chloride plastisol composition (A) containing an adhesion-imparting agent, formed on the film and a layer of a vinyl chloride plastisol composition (B) containing no adhesion-imparting agent, formed on the layer of the composition (A).

7 Claims, 1 Drawing Sheet

COMPOSITE POLYESTER SHEET AND PROCESS FOR ITS PRODUCTION

FIELD OF THE INVENTION

The present invention relates to a composite polyester sheet useful as a material for electronic and electric parts such as electric circuit substrates, particularly flexible printed circuit substrates, insulators for electric wires or flat cables.

DISCUSSION OF BACKGROUND

Various composite sheets composed of a polyester film and a plastisol have been proposed as materials for electronic and electric parts. Various properties such as the adhesion of the polyester film with the plastisol, the electrical insulating properties, the low temperature flexibility and the non-migration of plasticizer of e.g. an ABS resin to the packaging material, are required for the composite sheets to be useful as materials for such electronic or electrical parts.

The present inventors have previously proposed in Japanese Patent Application No. 99561/1986 a plastisol composition with an object to provide a material which is suitable as e.g. a resist for a flexible printed circuit substrate and which has practical adhesiveness to e.g. a polyester film while maintaining excellent electrical insulating properties even when dipped in a household cleaning solution.

In the earlier invention, the object was accomplished by incorporating an epoxy resin and a blocked polyisocyanate to a plastisol composition. However, when such a plastisol composition is laminated on a polyester film, a reaction between the polyisocyanate and the epoxy takes place, and if the proportion of the epoxy resin is increased to improve the electrical insulating properties, there has been a problem that the adhesiveness to the polyester film tends to decrease.

SUMMARY OF THE INVENTION

The present inventors have conducted extensive research to solve the above-mentioned problem and to obtain a composite sheet comprising a polyester film and a plastisol composition firmly bonded to the film, which does not lose its electrical insulating properties even when subjected to a severe condition, for example, even when directly contacted with or dipped in an alkaline aqueous solution or a cleaning agent solution containing it and which is useful for various applications without losing various properties. As a result, it has been found possible to solve such a problem by forming a layer for bonding on a polyester film and a layer for electric insulating properties, cleaning agent resistance and properties for non-migration of plasticizer thereon.

Namely, it is an object of the present invention to provide a composite polyester sheet having excellent chemical resistance, particularly excellent electrical insulating properties even when measured under dipping in an aqueous alkaline solution or in a cleaning agent solution containing it and having excellent electrical properties suitable for a material of electronic and electric parts such as flexible printed circuit substrates, and a process for producing such a composite polyester sheet.

The present invention provides a composite polyester sheet which comprises a polyester film, a layer of a vinyl chloride plastisol composition (A) containing an adhesion-imparting agent, formed on the film and a layer of a vinyl chloride plastisol composition (B) containing no adhesion-imparting agent, formed on the layer of the composition (A).

The present invention also provides a process for producing a composite polyester sheet, which comprises coating a vinyl chloride plastisol composition (A) containing an adhesion-imparting agent on a polyester film, followed by heat-melting and then solidifying the composition (A) to form a solidified layer, and lamination-coating a vinyl chloride plastisol composition (B) containing no adhesion-imparting agent on the solidified layer.

DETAILED DESCRIPTION OF THE PREFERRED EMBODIMENTS

Figure 1:
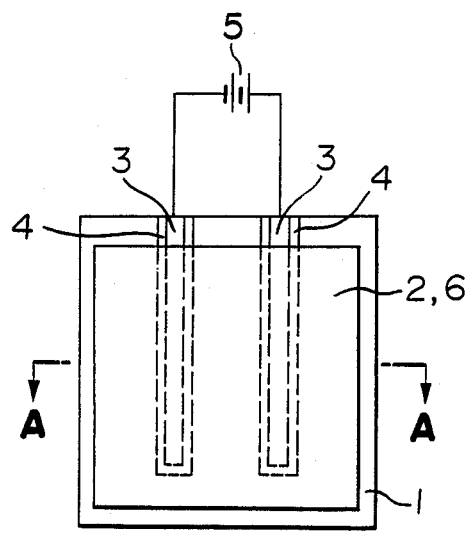
FIG. 1 is a plan view of a test piece for the measurement of electrical resistance for insulation.

Now, the present invention will be described in detail.

The vinyl chloride polymer as the main component of the plastisol composition (A) used in the present invention, is a paste resin prepared by the emulsion polymerization of vinyl chloride or a mixture of vinyl chloride with a comonomer copolymerizable therewith, in the presence of an emulsifier and an aqueous polymerization initiator, or a paste resin or a resin to be blended with a paste resin prepared by micro-suspension polymerization which comprises mechanically finely dispersing a part or entire amount of vinyl chloride or a mixture of vinyl chloride with a comonomer copolymerizable therewith, in the presence of a dispersant and an oil-soluble polymerization initiator, followed by polymerization. Further, a vinyl chloride resin having a large particle size produced by a usual suspension polymerization may be incorporated in an amount not to adversely affect the viscosity, fluidity, processability, etc. of the plastisol.

For the polymerization of a vinyl chloride polymer, it is common to use an emulsifier containing an alkali metal salt. However, in view of the adhesive properties of the plastisol composition and the electrical properties of the formed product, it is desirable to select an emulsifier so that the alkali metal content in the vinyl chloride polymer will be not higher than 600 ppm. As an emulsifier which brings about such a low alkali metal content in the vinyl chloride polymer, an ammonium salt or an alkali metal salt of an fatty acid having an alkyl group with from 8 to 18 carbon atoms may be mentioned as an example. However, the emulsifier is not restricted to such a specific example.

For the plastisol composition of the present invention, it is particularly preferred to employ a mixture of a paste resin of a vinyl chloride homopolymer having a metal content of at most 600 ppm with a resin to be blended with a paste resin having an average particle size within a range of from 10 to 50 μm, as a combination satisfying the electrical insulating properties, the adhesiveness, the storage stability, etc. The amount of the resin to be blended is usually within a range of from 5 to 50% by weight, based on the entire vinyl chloride polymer.

The plasticizer for the plastisol composition (A) for adhesion may be, for example, a phthalate plasticizer such as di-n-butyl phthalate (DBP), di-n-octyl phthalate, di-2-ethylhexyl phthalate (DOP), diisooctyl phthalate, octyldecyl phthalate, diisodecyl phthalate, butylbenzyl phthalate, di-2-ethylhexyl isophthalate or a mixed alkyl phthalate; a fatty acid ester plasticizer such as di-2-ethylhexyl adipate (DOA), di-n-decyl adipate, diisodecyl adipate, di-2-ethylhexyl azelate, dibutyl cebacate or di-2-ethylhexyl cebacate; a fatty acid polyester plasticizer having a OH value of at most 8, preferably at most 6, such as an adipic acid polyester or cebacic acid polyester; a phosphate plasticizer such as tributyl phosphate, tri-2-ethylhexyl phosphate, 2-ethylhexyldiphenyl phosphate or tricresyl phosphate; an epoxy plasticizer such as epoxidized soybean oil, epoxidized linseed oil or epoxidized tall oil fatty acid-2-ethylhexyl and an epoxy resin such as bisphenol glycidyl ether. These plasticizers may be used alone or in combination as a mixture of two or more different kinds in an amount of from 30 to 100 parts by weight.

The epoxy plasticizer and resin tend to react with the after-mentioned isocyanate and/or amide type adhesion-imparting agent and substantially lower the adhesive strength to the film substrate such as a polyester film, and their amount should be limited as low as possible and at most 5 parts by weight.

The plastisol composition (A) contains an adhesion-imparting agent such as a polyisocyanate compound, a polyisocyanate polymer or a blocked product thereof, or a polyaminoamide compound so that the adhesive properties will be imparted to the plastisol composition, or the composition may be used as an adhesive. Among them, a polyisocyanate compound, a polyisocyanate polymer and a blocked product thereof are most useful.

The polyisocyanate compound may be, for example, an fatty acid diisocyanate such as hexamethylene diisocyanate or lysine diisocyanate; an alicyclic diisocyanate such as hydrogenated diphenylmethane diisocyanate, isophorone diisocyanate or hydrogenated tolylene diisocyanate; and an aromatic diisocyanate such as tolylene diisocyanate, diphenylmethane diisocyanate, naphthylene diisocyanate or xylene diisocyanate. Among them, the aromatic diisocyanate, particularly tolylene diisocyanate or diphenylmethane diisocyanate is especially preferred. Then, the polyisocyanate polymer can be obtained by polymering such a polyisocyanate compound in accordance with a conventional method in an inert solvent such as ethyl acetate, methyl acetate, butyl acetate, methyl ethyl ketone or dioxane, or in a plasticizer such as a phthalate, a phosphate, an adipate or a trimellitate by using a well known catalyst such as a tertiary amine, a Mannich base, an alkali metal salt of a fatty acid or an alcoholate.

It is particularly preferred to employ a polyisocyanate polymer obtained by the polymerization of a polyisocyanate compound and containing isocyanurate rings, as the polyisocyanate polymer to be used in the present invention. The polymer containing isocyanurate rings may be prepared in accordance with the above-mentioned method. It is of course possible to employ as the polyisocyanate polymer, a polyurethane or polyurea having so-called isocyanate terminal groups, obtained by the reaction of a polyisocyanate with an active hydrogen compound.

The sealing agent i.e. the blocking agent to be used for preventing the low temperature reactivity for isocyanate groups, may be, for example, a long chain alkylphenol, an oxybenzoic acid ester or a lactam. Of course, the blocking agent is not restricted to such specific examples. The blocking agent is used usually in an amount about stoichiometric to free isocyanate groups. The blocking of the isocyanate groups can readily be made in the above-mentioned medium to obtain a blocked product of the polyisocyanate or a blocked product of the polyisocyanate polymer. The average molecular weight of the blocked product of e.g. a diisocyanate polymer is preferably within a range of from 1,000 to 10,000. If the average molecular weight of the blocked product is less than 1,000, no adequate anchoring effect as an adhesive can be obtained, and the adhesive strength will be inadequate. On the other hand, if the average molecular weight exceeds 10,000, the viscosity of the plastisol composition tends to increase remarkably, such being undesirable.

The amount of the adhesion-imparting agent is preferably within a range of from 1 to 25 parts by weight, per 100 parts by weight of the vinyl chloride polymer, so that the effective NCO content in the plastisol composition is usually within a range of from 0.01 to 1% by weight, preferably from 0.03 to 0.6% by weight, more preferably from 0.05 to 0.5% by weight.

As the polyaminoamide compound, a commercially available product such as Euretek 505 or Euretek 506 (tradename, Shering Company) may suitably be employed.

The plastisol composition (A) usually contains a stabilizer. Such a stabilizer may be an inorganic metal compound such as white lead, basic lead silicate, tribasic lead sulfate, tribasic lead phosphite, silica gel co-precipitated lead silicate or zinc white, and an organic compound such as a metal salt, e.g. a cadmium, barium, calcium, zinc, lead, tin or magnesium salt, of lauric acid, stearic acid, ricinolic acid, naphthenic acid, salicylic acid, 2-ethylhexoinic acid fatty acid or resin acid, and it also includes zinc octylate, dibutyltin laurate, dioctyltin maleate and dibutyltin mercaptide. Further, it is possible to employ organic acid liquid composite stabilizers of e.g. calcium-zinc, barium-zinc, magnesium-zinc, cadmium-barium-zinc types, which are commercially available usually as stabilizers for vinyl chloride resins. There is no particular restriction as to the amount of the stabilizer. However, it is used usually in an amount of from 0.5 to 10 parts by weight, preferably from 1 to 5 parts by weight, per 100 parts by weight of the vinyl chloride polymer, to achieve the purpose.

According to the present invention, the plastisol composition (B) is laminated on the layer of the plastisol composition (A) to provide the cleaning agent resistance, the electrical insulating properties and the properties for non-migration of plasticizer.

There is no particular restriction as to the vinyl chloride polymer to be used as the main component of the plastisol composition (B). However, it is preferred to employ the paste resin or the resin to be blended with a paste resin, as mentioned above with respect to the plastisol composition (A).

The plasticizer as another component may be the one commonly employed as in the case of the plastisol composition (A). However, it is particularly preferred to employ an epoxy plasticizer or resin, or a polyester plasticizer in order to satisfy the cleaning agent resistance, the electrical insulating properties and the properties for non-migration of plasticizer as purported by the present invention.

The epoxy plasticizer may be epoxidized soybean oil or epoxidized tail oil fatty acid-2-ethylhexyl. The epoxy resin may be a glycidyl ether type epoxy resin such as bisphenol A diglycidyl ether, bisphenol F diglycidyl ether, brominated or chlorinated bisphenol A diglycidyl ether, resorcinol diglycidyl ether, novolak glycidyl ether, a polyalkylene glycol diglycidyl ether, glycerol triglycidyl ether or hydrogenated bisphenol A glycidyl ether; a glycidyl ester type epoxy resin such as diglycidyl phthalate, diglycidyl hexahydrophthalate or glycidyl acrylate; a glycidyl ether-ester type epoxy resin such as p-oxybenzoic acid glycidyl ether ester; a glycidyl amine type epoxy resin such as glycidyl aniline or triglycidyl isocyanurate; a linear aliphatic epoxy resin such as epoxidized polybutadiene; and an alicyclic epoxy resin such as 3,4-epoxy-6-methylcyclohexylmethyl, 3,4-epoxy-6-methylcyclohexane carboxylate, bis(3,4-epoxy-6-methylcyclohexylmethyl) adipate, vinylcyclohexene diepoxide or bis(2,3-epoxycyclopentyl) ether. These plasticizers may be used alone or in combination as a mixture of two or more.

For the plastisol composition (B) to be used in the present invention, it is preferred to employ a glycidyl ether type epoxy resin, a glycidyl ether-ester type epoxy resin, a glycidyl ester type epoxy resin or an alicyclic type epoxy resin among the epoxy resins mentioned above. Among them, those which are liquid at room temperature are particularly preferred to obtain the fluidity as plastisol.

The polyester plasticizer may be suitably selected for use among those having an average molecular weight of from 600 to 4,000, preferably from 1,500 to 2,000.

When the above-mentioned epoxy plasticizer or resin or the polyester plasticizer is used, a part thereof may be substituted by a usual plasticizer as mentioned above with respect to the plastisol composition (A) or by a diluent such as mineral spirit, hexanol isobutyrate or dodecylbenzene, or by an organic solvent capable of permitting the vinyl chloride polymer to swell such as toluene or xylene, to form an organo plastisol.

The epoxy plasticizer or resin, or the polyester plasticizer is used usually at least 10 parts by weight, preferably from 15 to 70 parts by weight, to accomplish the object of the present invention. If the amount is less than this range, the electrical insulating properties and the properties for non-migration tend to be hardly satisfied, and if the amount exceeds this range there will be an adverse effect with respect to the plastisol viscosity, the flexibility, the bleeding or the physical properties.

With respect to the stabilizer, there may be employed a stabilizer of the same type as mentioned above with respect to the plastisol composition (A).

To the plastisol compositions (A) and (B) of the present invention, various additives other than the above components, such as a filler, a thickener, a diluent, a coloring agent and the like may be incorporated. Of course, other additives are not restricted to such specific examples. The filler includes an inorganic filler such as precipitated or ground calcium carbonate, talc, diatomaceous earth, kaolin or clay, and an organic filler such as cellulose powder, liquid or powder rubber e.g. nitrile butadiene or regenerated rubber. The thickener includes anhydrous silica, organic bentonite or a metal soap.

In the process of the present invention, it is preferred to use a polyester film having a thickness of from 10 to 300 μm, more preferably from 30 to 200 μm, as the base material of the composite polyester sheet.

For the production of a composite polyester sheet according to the process of the present invention, the plastisol composition (A) containing an adhesion-imparting agent is coated on the polyester film by various coating means such as reverse rolls, a knife coater, a spray, a curtain flow, dip coating, a rotary screen, a flat screen, a flexor or gravure printing, followed by heating at a temperature higher than the melting point of the plastisol composition to crosslink and adhere a vinyl chloride resin film or sheet composed of the plastisol composition to the polyester film. The thickness of the coated layer of the plastisol composition (A) is preferably within a range of from 1 to 1,000 μm, practically within a range of from 10 to 200 μm. The coated plastisol composition (A) is heated to a temperature within a range of from 90° to 250° C. by e.g. an infrared heater, a far infrared heater, a high frequency heater or a hot air circulating furnase for melting and solidified.

Then, the plastisol composition (B) containing no adhesion-imparting agent is laminated thereon in the same manner. The thickness of the layer of the plastisol composition (B) is usually at least 30 μm in view of the cleaning agent resistance and the electrical insulating properties.

The composite polyester sheet produced by the process of the present invention may be used by itself as an electric circuit substrate. Otherwise, it may be used as a coating material for conductive wires, which is useful for the production of coated electric wires, or flat cables in such a manner that bare electric wires or flat conductive wires are positioned between a pair of composite polyester sheets with the vinyl chloride resin sides facing to each other, followed by heat-pressing.

In the composite polyester sheet produced by the method of the present invention, the adhesion-imparting agent effectively reacts with the base material, whereby the polyester film as the base material and the plastisol composition are bonded firmly to each other. On the other hand, by providing a layer of the plastisol composition (B) on the layer of the plastisol composition (A) as an adhesive layer, the migration of plasticizer to a packaging material can be prevented, and thus the composite sheet has excellent cleaning agent resistance and electrical insulating properties. Further, the composition of the layer of the plastisol composition (B) may be freely adjusted to provide various or highly effective properties. Accordingly, the composite polyester sheet of the present invention is suitable for use as a material for electrical parts of business or household electrical equipments such as washing machines, cleaners or electronic ranges or as a material for electronic parts, particularly for a flexible printed circuit substrates.

Now, the present invention will be described with reference to Examples. However, it should be understood that the present invention is by no means restricted to such specific Examples.

The methods for the evaluation of plastisol compositions or molded products in the Examples were as follows:

(1) Tests of the viscosity and the storage stability of the plastisol compositions The viscosity at 10 rpm was measured at a plastisol temperature of 23°±1° C. by means of B8H model viscometer (No. 6 rotor) manufactured by Tokyo Keiki K.K.

The storage stability was determined by leaving the plastisol composition to stand at the same temperature for a predetermined number of days, stirring it gently with a stirring rod for one minute two hours prior to the measurement of the viscosity, and measuring the plastisol viscosity as mentioned above.

(2) Electrical resistance for insulation

A test piece for measuring the electrical resistance for insulation as shown in the drawings was prepared in the following manner.

Figure 2:
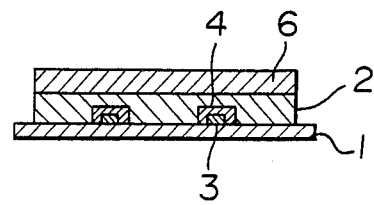
FIG. 2 is a cross sectional view taken along line A—A of FIG. 1.

FIG. 1 shows a plan view of the test piece for measuring the electrical resistance for insulation, and FIG. 2 is a cross sectional view taken along line A—A of FIG. 1. In the drawings, reference numeral 1 indicates a polyethylene terephthalate film having a thickness of 90 μm and numerals 2 and 6 represent vinyl chloride resin layers formed by coating the plastisol composition (A) of the present invention and the plastisol composition (B) thereon. Numeral 3 represents a silver paste, numeral 4 represents a conductive carbon coating material, and numeral 5 represents a power source.

The test piece was prepared by printing a conductor of the silver paste 3 on a polyethylene terephthalate film 1 in a linear shape with a thickness of 10 μm, a width of 0.6 mm and a distance between lines of 2.4 mm by a flat plate screen (200 mesh), followed by heating, and then coating a conductive carbon coating material 4 on the silver paste 3 in a thickness of 20 μm with a width of 10 mm to cover the silver paste 3 with a distance between the lines of 2 mm. Then, the plastisol composition (A) containing the adhesion-imparting agent was printed on a polyethylene terephthlate film in a thickness of 40 μm by a flat plate screen of 120 mesh and once heated at 160° C. for 5 minutes, followed by cooling. Then, the plastisol composition (B) containing an epoxy resin was also coated under the same condition to obtain a laminated coating.

The thicknesses of the layers of the plastisol compositions (A) and (B) were about 40 μm, respectively.

This test piece was dipped in the original solution of Magicline (tradename for an aqueous solution of a nonionic surfactant of pH 11-12, manufactured by Kao Corporation) at 50° C. so that 90% of the vinyl chloride resin layers 2 and 6 were immersed, and 250V was applied by a power source 5. Upon expiration of 24 hours, the resistance for insulation was calculated on the basis of the Ohm's law. The resistance value for insulation was represented by an average value (AVE) of 20 test pieces.

According to the evaluation standards, an average value of at least 20 MΩ was good, and an average value of less than 20 MΩ was inferior.

(3) T-type peeling strength

Of the test piece prepared in (2), a portion where the conductive paste coating material was not printed, was taken to obtain a test piece having a width of 2.54 cm and a length of 8 cm, and the test piece was left to stand in a constant temperature room for about 3 days. Then, from one end of the test piece, the layer of the plastisol composition (A) and the polyethylene terephthalate film were peeled at a tensile rate of 50 mn/min in a longitudinal direction to conduct a T-type peeling test at 180° C., whereby the adhesive strength was measured. The adhesive strength was represented by an average peeling strength (unit: kg/inch) of five test pieces.

The following Table 1 shows a total of 5 types of compositions for the plastisol compositions (A) and (B) used in Examples 1 to 3 and Comparative Examples 1 and 2.

TABLE 1

| Blended agents | Plastisol compositions (A) and (B) (wt %) | | | | |
|---|---|---|---|---|---|
| | a | b | c | d | e |
| Paste resin *1 P = 1,500 | 65 | 65 | 65 | 65 | 65 |
| Blending resin (D = 35-40) | 35 | 35 | 35 | 35 | 35 |
| Phthalic plasticizer (DOP) | 40 | 40 | — | — | 20 |
| Polyester plasticizer *2 MW = 1700 | — | — | 40 | 50 | — |
| Epoxy resin *3 | — | 45 | 45 | 30 | 45 |
| Blocked polyisocyanate solution *4 | 15 | — | — | — | 30 |
| Tribasic lead sulfate *5 | 3 | — | — | — | 3 |
| Ba—Zn stabilizer *6 | — | 3 | 3 | 3 | — |
| Thickner *5 | 0.5 | 0.5 | 0.5 | 0.5 | 0.5 |

*1: P-540, manufactured by Mitsubishi Kasei Vinyl Company
*2: D-653, manufactured by Mitsubishi Kasei Vinyl Company
*3: Epicoat 152, manufactured by Yuka Shell Epoxy K.K.
*4: 33 wt % DBP solution of TDI isocyanurate polymer blocked with 2-ethylhexyl p-oxybenzoate (MW = 1,300)
*5: The tribasic lead sulfate and the thickner were preliminarily mixed with DOP by three rolls to obtain a toner.
*6: AC-303, manufactured by Adeka Argus K.K.

The respective compositions for the above-mentioned five types of plastisol compositions a,b,c,d and e were mixed in the following manner.

The plasticizer, the epoxy resin the stabilizer, the thickner, the paste resin and the blending resin were introduced into a Hobert mixer and uniformly mixed, followed by defoaming under vacuum to obtain a plastisol composition. The blocked polyisocyanate solution was added to a plastisol which had been once defoarmed and mixed, and the mixture was uniformly mixed and again defoarmed under vacuum to obtain a plastisol.

The combinations of the plastisol compositions (A) and (B) in Examples 1 to 3 and Comparative Examples 1 and 2 and the results of their evaluation are shown in Table 2. The evaluation of the viscosity and the storage stability of the plastisol compositions was made with respect to the plastisol compositions (B) of Examples and Comparative Examples.

TABLE 2

| | No. | | | | |
|---|---|---|---|---|---|
| | Examples | | | Comparative Examples | |
| | 1 | 2 | 3 | 1 | 2 |
| | Plastisol compostions (A) | | | | |
| | a | a | a (B) | a | e |
| Evaluation | b | c | d | a | e |
| 1. Plastisol viscosity (poise) and stability of composition (B): | | | | | |
| Initial | 320 | 720 | 600 | 200 | 450 |
| 28 days later | 530 | 1030 | 800 | 550 | 680 |
| 2. Insulating resistance (MΩ) | 150 | 165 | 145 | <10 | 144 |
| 3. T-type peeling strength (kg/inch) | 0.86 | 0.85 | 0.86 | 0.87 | 0.23 |

As is evident from Table 2, the two coating layer products of Examples 1 to 3 have excellent electrical insulating properties under immersion in a cleaning agent solution, and they are excellent also in the adhesion of the plastisol layer to the polyester film layer.

Particularly in Examples 2 and 3 wherein a polyester plasticizer is used in the plastisol composition (B), the products exhibit excellent properties for non-migration of plasticizer to e.g. an acrylic adhesive or an ABS resin, and they are suitable as materials for flexible printed circuit substrates for membrane switches.

What is claimed is:

1. A composite polyester sheet which comprises a polyester film, a layer of a vinyl chloride plastisol composition (A) containing A polyisocyanate compound, a polyisocyanate polymer or a blocked product thereof, or a polyaminoamide as an adhesion-imparting agent, formed on the film and a layer of a vinyl chloride plastisol composition (B) containing no adhesion-imparting agent, formed on the layer of the composition (A).

2. The composite polyester sheet according to claim 1, wherein the adhesion-imparting agent contained in the plastisol composition (A) is a polyisocyanate or a polyisocyanate polymer.

3. The composite polyester sheet according to claim 2, wherein the polyisocyanate polymer has an isocyanurate ring.

4. The composite polyester sheet according to claim 1, wherein the plastisol composition (B) contains an epoxy plasticizer or an epoxy resin as a plasticizer component.

5. The composite polyester sheet according to claim 4, wherein the epoxy resin is liquid at room temperature.

6. The composite polyester sheet according to claim 1, wherein the plastisol composition (B) contains a polyester plasticizer as a plasticizer component.

7. A process for producing a composite polyester sheet, which comprises coating a vinyl chloride plastisol composition (A) containing a polyisocyanate compound, a polyisocyanate polymer or a blocked product thereof, or a polyaminoamide as an adhesion-imparting agent on a polyester film, followed by heat-melting and then, solidifying the composition (A) to form a solidified layer, and lamination-coating a vinyl chloride plastisol composition (B) containing no adhesion-imparting agent on the solidified layer.

* * * * *